(12) United States Patent
Meng

(10) Patent No.: US 9,112,456 B2
(45) Date of Patent: Aug. 18, 2015

(54) ASSEMBLY STRUCTURE OF POWER AMPLIFIER

(75) Inventor: Qingnan Meng, Wuhan (CN)

(73) Assignee: Wuhan Gewei Electronic Technology Co., Ltd., Wuhan (CN)

( * ) Notice: Subject to any disclaimer, the term of this patent is extended or adjusted under 35 U.S.C. 154(b) by 0 days.

(21) Appl. No.: 14/386,565

(22) PCT Filed: Apr. 6, 2012

(86) PCT No.: PCT/CN2012/073560
§ 371 (c)(1),
(2), (4) Date: Sep. 19, 2014

(87) PCT Pub. No.: WO2013/123691
PCT Pub. Date: Aug. 29, 2013

(65) Prior Publication Data
US 2015/0048888 A1     Feb. 19, 2015

(30) Foreign Application Priority Data
Feb. 21, 2012  (CN) .......................... 2012 1 0039358

(51) Int. Cl.
*H05K 7/20* (2006.01)
*H03F 1/30* (2006.01)
*H04B 1/03* (2006.01)
*H04N 1/036* (2006.01)

(52) U.S. Cl.
CPC .. *H03F 1/30* (2013.01); *H04B 1/03* (2013.01); *H04N 1/036* (2013.01); *H05K 7/20509* (2013.01); *H03F 2200/447* (2013.01)

(58) Field of Classification Search
USPC ........................ 361/676–678, 679.46–679.54, 361/688–722, 752, 760, 790, 792, 796, 831
See application file for complete search history.

(56) References Cited

U.S. PATENT DOCUMENTS

| | | | |
|---|---|---|---|
| 6,473,314 B1 | 10/2002 | Custer et al. | |
| 6,477,286 B1 * | 11/2002 | Ouchi | 385/14 |
| 7,864,532 B1 * | 1/2011 | Ehret et al. | 361/713 |
| 8,488,312 B2 * | 7/2013 | Nelson et al. | 361/679.47 |
| 2003/0060172 A1 * | 3/2003 | Kuriyama et al. | 455/90 |
| 2009/0311974 A1 * | 12/2009 | Nelson et al. | 455/90.2 |
| 2012/0001809 A1 * | 1/2012 | Peng et al. | 343/702 |
| 2014/0106684 A1 * | 4/2014 | Burns et al. | 455/78 |

FOREIGN PATENT DOCUMENTS

| | | |
|---|---|---|
| CN | 201700111 | 1/2011 |
| CN | 201928509 | 8/2011 |
| CN | 202535311 | 11/2012 |

* cited by examiner

*Primary Examiner* — Courtney Smith
(74) *Attorney, Agent, or Firm* — Hamre, Schumann, Mueller & Larson, P.C.

(57) ABSTRACT

An assembly structure of a power amplifier is provided. The assembly structure comprises at least two power amplifier modules, each power amplifier module comprises a heat-conducting board, an amplifier tube matching circuit board is assembled on the heat-conducting board; at least one radio frequency power amplifier tube is assembled on the amplifier tube matching circuit board, assembly directions of all the radio frequency power amplifier tubes are parallel to each other; the heat-conducting boards of adjacent two power amplifier modules are connected vertically along a transmission direction of the radio frequency signal. Comparing with the existing plane assembly technology, the application has a character of needing small assembly areas, which is adapted in an assembly environment with a certain height and small assembly areas.

6 Claims, 3 Drawing Sheets

ASSEMBLY STRUCTURE OF POWER AMPLIFIER

FIELD OF THE INVENTION

The present application relates to a field of base station power amplifier technology, and more particularly relates to an assembly structure of a power amplifier, especially an assembly method of the power amplifier in an assembly environment with small assembly areas and a certain height.

BACKGROUND OF THE INVENTION

Radio frequency power amplifier is a key part of a wireless communication base station system. Currently in order to meet the requirements of high power and high efficiency, the power amplifiers are mainly consisted of multi amplifier tubes etc. The assembly method of the conventional power amplifiers is shown in FIGS. 1 and 2, and is basically an intrinsic mode resulted by plane assembly of a radio frequency power amplifier, that is, all radio frequency power amplifier tubes 1 and amplifier tube matching circuit boards 2 are horizontally mounted on a big heat-conducting board 3, and then are horizontally mounted on a heat-sink, so that the heat of the radio frequency power amplifier tubes can be dissipated efficiently.

Though the above-mentioned assembly structure of power amplifiers can achieve a better heat dissipation effect, but there are certain limitations in some conditions. For example, in an assembly environment with an enough height and small flat assembly size, if a plane assembly structure of multi radio frequency power amplifier tubes is still adopted, the plane assembly structure is limited by space, and can't be assembled in the assembly environment, so a better assembly structure in this assembly environment needs to be developed.

SUMMARY OF THE INVENTION

The objective of the present application is to provide an assembly structure of a power amplifier adapted in an assembly environment with a certain height and small assembly areas.

In order to resolve above problem the technical solutions of the present application are as follows:

In one aspect, an assembly structure of a power amplifier is provided, the assembly structure comprises at least two power amplifier modules, each of the power amplifier module includes a heat-conducting board; an amplifier tube matching circuit board is assembled on the heat-conducting board; at least one radio frequency power amplifier tube is assembled on the amplifier tube matching circuit board; assembly directions of all the radio frequency power amplifier tubes are parallel to each other; heat-conducting boards of adjacent two power amplifier modules are vertically connected with each other along a transmission direction of a radio frequency signal; one or several kinds of components selected from a micro strip line, a cable line and an electronic element are arranged on the amplifier tube matching circuit board; a connecting method of an AC signal or a DC signal between the said power amplifier modules is one or several kinds of connecting methods selected from a micro strip line connection, a cable connection, a connecting element connection.

In one embodiment, a connecting method of the heat-conducting boards of adjacent power amplifier modules is one or several kinds of connecting methods selected from fixing with screws, soldering and pasting with glue.

In another embodiment, an assembly method of assembling the amplifier tube matching circuit board on the heat-conducting board is one or several kinds of connecting methods selected from fixing with screws, soldering and pasting with glue.

In another embodiment, the number of the power amplifier modules is two; one of the power amplifier modules is arranged horizontally, and the other one is vertically mounted on the heat-conducting board of the horizontal power amplifier module along the transmission direction of the radio frequency signal to form a L-shaped structure; and a bottom surface of the horizontal power amplifier module is assembled on a heat-sink.

In another embodiment, the number of the power amplifier modules is three; one of the power amplifier modules is arranged horizontally, and the other two power amplifier modules are vertically mounted on the heat-conducting board of the horizontal power amplifier module along the transmission direction of the radio frequency signal to form a U-shaped structure; a bottom surface of the horizontal power amplifier module is assembled on a heat-sink.

In another embodiment, the number of the power amplifier modules is four, and the first power amplifier module is arranged horizontally, and the second power amplifier module and the third power amplifier module are vertically mounted on the heat-conducting board of the horizontal power amplifier module along the transmission direction of the radio frequency signal, and the fourth power amplifier module is horizontally arranged on the top of the second power amplifier module and the third power amplifier module to form a square-shaped structure; a bottom surface of the first horizontal power amplifier module is assembled on a heat-sink.

When implementing the present application, the following advantageous effects can be achieved: compared with conventional plane assembly technology, the application has a character of needing small assembly areas, which is adapted in an assembly environment with a certain height and small assembly areas; moreover, this assembly structure can meet thermal design requirements, which is determined by thermal simulation and thermal measurement.

DETAILED DESCRIPTION OF THE PREFERRED EMBODIMENT

First Embodiment

Figure 1:
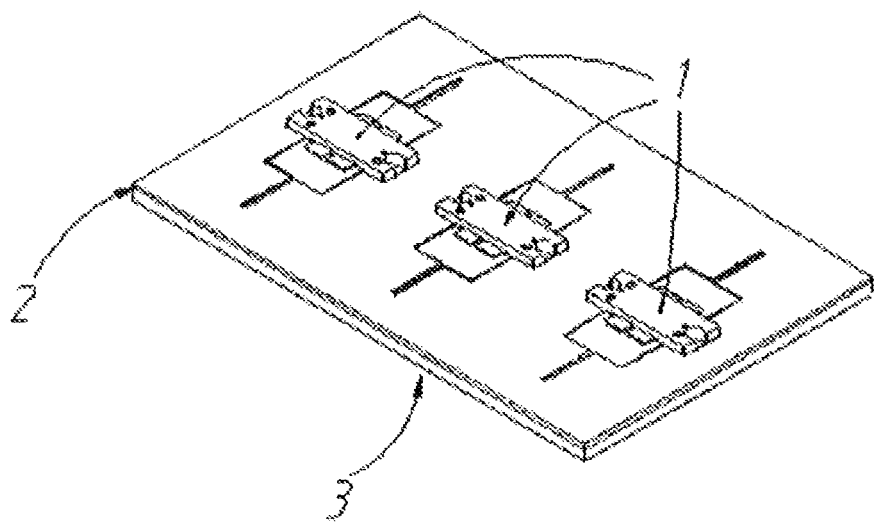
FIG. 1 is an isometric view of an assembly structure of a conventional power amplifier.
Figure 2:
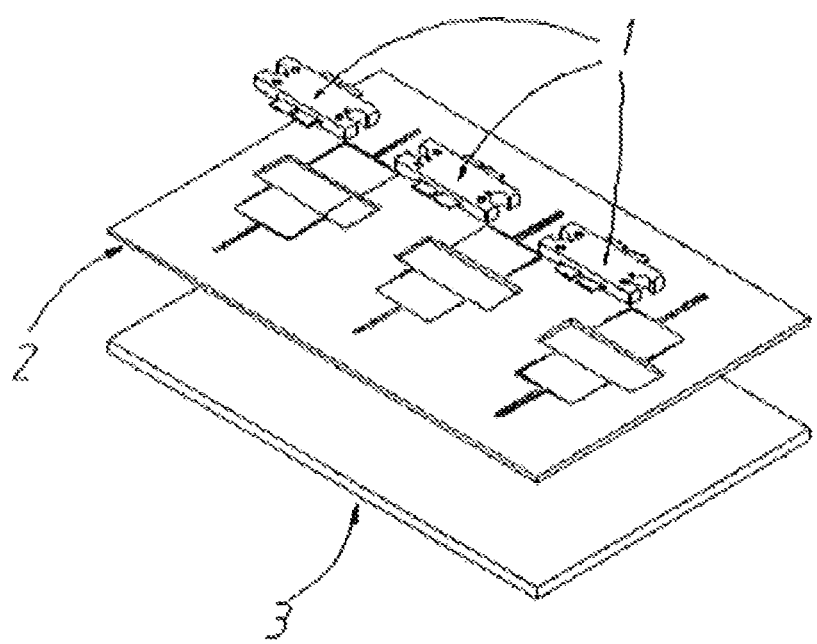
FIG. 2 is an exploded schematic view of an assembly structure of the conventional power amplifier.
Figure 3:
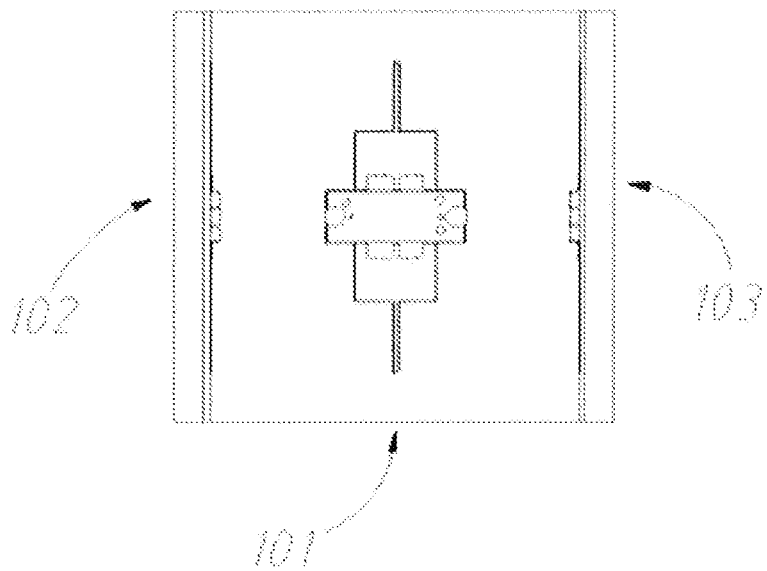
FIG. 3 is a front view of a first embodiment of the present application.
Figure 4:
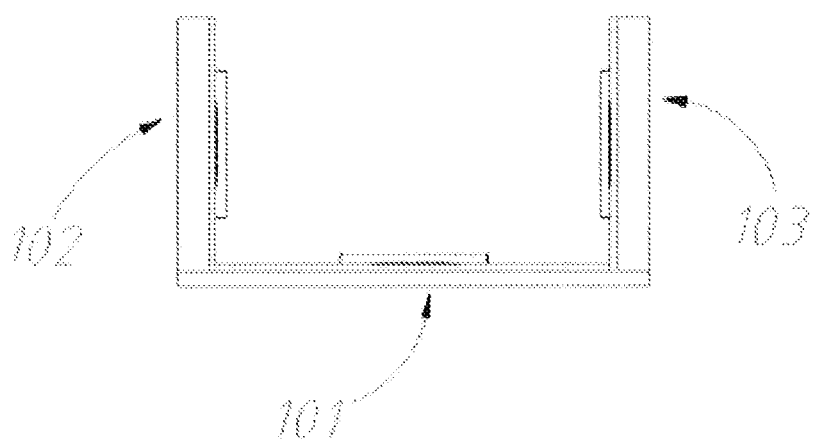
FIG. 4 is an anterior view of the first embodiment of the present application.
Figure 5:
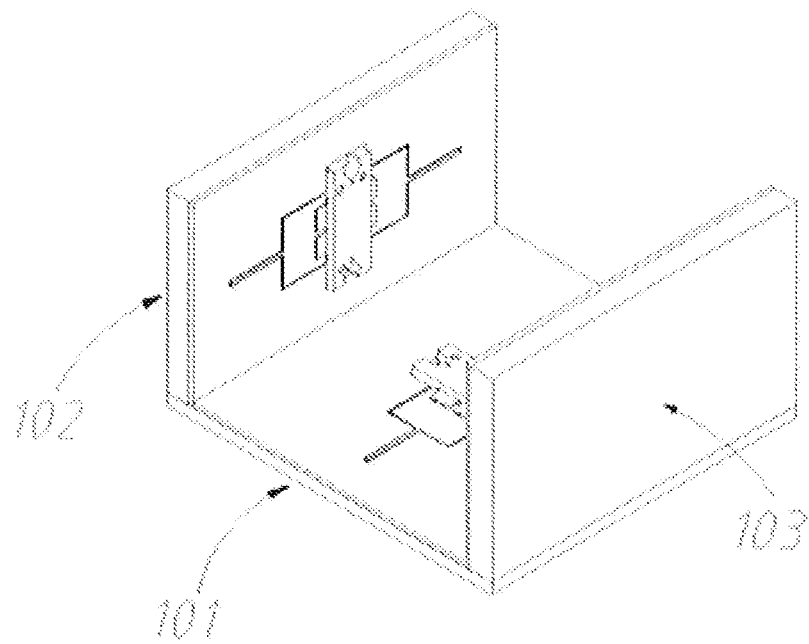
FIG. 5 is an isometric view of the first embodiment of the present application.

FIG. 3 is a front view of a first embodiment of the present application; FIG. 4 is an anterior view of the first embodiment of the present application; FIG. 5 is an isometric view of the first embodiment of the present application; the assembly structure comprises three power amplifier modules; one of the power amplifier modules 101 is arranged horizontally, and the other two power amplifier modules 102, 103 are vertically mounted on a heat-conducting board of the horizontal power amplifier module 101 along a transmission direction of a radio frequency signal; a bottom surface of the horizontal power amplifier module 101 is assembled on a heat-sink; three power amplifier modules form a U-shaped structure.

Figure 6:
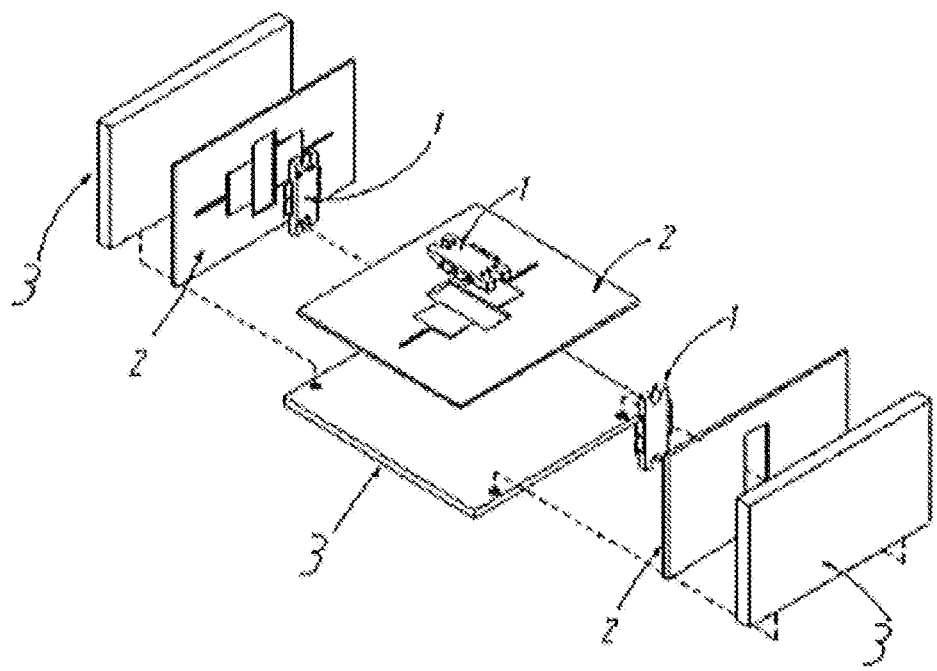
FIG. 6 is an exploded schematic view of the first embodiment of the present application.

FIG. 6 is an exploded schematic view of the first embodiment of the present application. Each of the power amplifier modules includes a heat-conducting board 3. An amplifier tube matching circuit board 2 is assembled on the heat-conducting board 3; at least one radio frequency power amplifier tube 1 is mounted on the amplifier tube matching circuit board 2; a plane of the power amplifier module is parallel to the transmission direction of the radio frequency signal; assembly directions of all the radio frequency power amplifier tube 1 are parallel to each other; heat-conducting boards 3 of adjacent power amplifier modules are connected with each other; one or several kinds of components selected from a micro strip line, a cable line and an electronic element are arranged on the amplifier tube matching circuit board 2; a connecting method of an AC signal or a DC signal between the said power amplifier modules is one or several kinds of connecting methods selected from a micros trip line connection, a cable connection, a connecting element connection.

A connecting method of adjacent heat-conducting boards is one or several kinds of connecting method selected from fixing with screws, soldering and pasting with glue. The present embodiment adopts a connecting method of fixing with screws to achieve assembly for ensuring a good contact, which is good for heat conducting.

A connecting method between the amplifier tube matching circuit board and the heat-conducting board is one or several kinds of connecting methods selected from fixing with screws, soldering and pasting with glue. The present embodiment adopts a soldering method.

The heat-conducting board can be made of one or several heat-conducting and current-conducting materials such as copper material and aluminum material, etc. In the present embodiment, for ensuring a good heat-conducting, the copper material is adopted.

Second Embodiment

As shown in an implementation way of the first embodiment, the present application further provides another implementation way.

The number of power amplifier modules is two, and one of the power amplifier modules is arranged horizontally, and the other one is vertically mounted on the heat-conducting board of the horizontal power amplifier module along the transmission direction of the radio frequency signal to form a L-shaped structure, and a bottom surface of the horizontal power amplifier module is assembled on a heat-sink.

Third Embodiment

The number of power amplifier modules is four, and the first power amplifier module is arranged horizontally, and the second power amplifier module and the third power amplifier module are vertically mounted on the heat-conducting board of the horizontal power amplifier module along the transmission direction of the radio frequency signal, and the fourth power amplifier module is horizontally arranged on the top of the second power amplifier module and the third power amplifier module to form a square-shaped structure, and a bottom surface of the first horizontal power amplifier module is assembled on a heat-sink.

The length of the horizontal power amplifier module and the number of the radio frequency power amplifier tubes mounted on the horizontal power amplifier module are determined by the assembly areas; the height of the vertical power amplifier module and the number of the radio frequency power tubes mounted on the vertical power amplifier module are determined by the assembly height.

While the preferred embodiments of the present application are described above, the present application is not limited to the above-mentioned specific implementations. In the inspiration of the present application, those ordinary skills in the art can also make many modifications without breaking away from the subject of the present application and the protection scope of the claims. All these modifications belong to the protection of the present application.

What is claimed is:

1. An assembly structure of a power amplifier, wherein the assembly structure comprises at least two power amplifier modules, each of the power amplifier modules includes a heat-conducting board; an amplifier tube matching circuit board is assembled on the heat-conducting board; at least one radio frequency power amplifier tube is assembled on the amplifier tube matching circuit board; assembly directions of each of the radio frequency power amplifier tubes are parallel to each other; heat-conducting boards of adjacent two power amplifier modules are vertically connected with each other along a transmission direction of a radio frequency signal; one or several kinds of components selected from a microstrip line, a cable line and an electronic element are arranged on the amplifier tube matching circuit board; a connecting method of an AC signal or a DC signal between the said power amplifier modules is one or several kinds of connecting methods selected from a microstrip line connection, a cable connection, a connecting element connection.

2. The assembly structure of the power amplifier according to claim 1, wherein a connecting method of the heat-conducting boards of adjacent power amplifier modules is one or several kinds of connecting methods selected from fixing with screws, soldering and pasting with glue.

3. The assembly structure of the power amplifier according to claim 1, wherein an assembly method of assembling the amplifier tube matching circuit board on the heat-conducting board is one or several kinds of connecting methods selected from fixing with screws, soldering and pasting with glue.

4. The assembly structure of the power amplifier according to claim 1, wherein the number of the power amplifier modules is two; one of the power amplifier modules is arranged horizontally, and the other one is vertically mounted on the heat-conducting board of the horizontal power amplifier module along the transmission direction of the radio frequency signal to form a L-shaped structure; and a bottom surface of the horizontal power amplifier module is assembled on a heat-sink.

5. The assembly structure of the power amplifier according to claim 1, wherein the number of the power amplifier modules is three; one of the power amplifier modules is arranged horizontally, and the other two power amplifier modules are vertically mounted on the heat-conducting board of the horizontal power amplifier module along the transmission direction of the radio frequency signal to form a U-shaped structure; a bottom surface of the horizontal power amplifier module is assembled on a heat-sink.

6. The assembly structure of the power amplifier according to claim 1, wherein the number of the power amplifier modules is four, and the first power amplifier module is arranged horizontally, and the second power amplifier module and the third power amplifier module are vertically mounted on the heat-conducting board of the horizontal power amplifier module along the transmission direction of the radio frequency signal, and the fourth power amplifier module is horizontally arranged on the top of the second power amplifier module and the third power amplifier module to form a square-shaped structure; a bottom surface of the first horizontal power amplifier module is assembled on a heat-sink.

* * * * *